(12) United States Patent
Cheng et al.

(10) Patent No.: US 11,527,446 B2
(45) Date of Patent: Dec. 13, 2022

(54) TRANSISTOR HAVING STRAIN-INDUCING ANCHORS AND A STRAIN-ENHANCING SUSPENDED CHANNEL

(71) Applicant: International Business Machines Corporation, Armonk, NY (US)

(72) Inventors: Kangguo Cheng, Schenectady, NY (US); Juntao Li, Cohoes, NY (US); Julien Frougier, Albany, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 535 days.

(21) Appl. No.: 16/410,187

(22) Filed: May 13, 2019

(65) Prior Publication Data
US 2020/0365467 A1     Nov. 19, 2020

(51) Int. Cl.
*H01L 21/8238* (2006.01)
*H01L 27/092* (2006.01)
(Continued)

(52) U.S. Cl.
CPC ........... *H01L 21/823821* (2013.01); *H01L 21/02532* (2013.01); *H01L 21/823807* (2013.01);
(Continued)

(58) Field of Classification Search
CPC ....... H01L 21/823821; H01L 21/02532; H01L 21/823807; H01L 21/823828; H01L 27/092; H01L 27/0924; H01L 29/0649; H01L 29/0673; H01L 29/1054; H01L 29/165; H01L 29/42392; H01L 29/66545; H01L 29/66795; H01L 29/6681; H01L 29/7842; H01L 29/7843; H01L 29/7849;
(Continued)

(56) References Cited

U.S. PATENT DOCUMENTS

| | | |
|---|---|---|
| 8,778,768 B1 | 7/2014 | Chang et al. |
| 9,741,792 B2 | 8/2017 | Cheng et al. |

(Continued)

OTHER PUBLICATIONS

Anonymous, "Method and Structure for forming fully isolated Inserted-Oxide FinFET (i-FinFET)—Method 3," IPCOM000253950D, May 2018, 9 pages.

(Continued)

*Primary Examiner* — Hoang-Quan Ho
(74) *Attorney, Agent, or Firm* — Cantor Colburn LLP; Joseph Petrokaitis

(57) ABSTRACT

Embodiments of the invention are directed to a fabrication method that includes forming a first-region channel over a first region of a substrate, wherein the first-region channel further includes lateral sidewalls having a length (L), a first end sidewall having a first width (W1), and a second end sidewall having a second width (W2). L is greater than W1, and L is greater than W2. A first stress anchor is formed on the first end sidewall of the first-region channel, and a second stress anchor is formed on the second end sidewall of the first-region channel. The first stress anchor is configured to impart strain through the first end sidewalls to the first-region channel. The second stress anchor is configured to impart strain through the second end sidewalls to the first-region channel.

17 Claims, 13 Drawing Sheets

(51) Int. Cl.
  *H01L 29/06* (2006.01)
  *H01L 29/78* (2006.01)
  *H01L 29/10* (2006.01)
  *H01L 29/786* (2006.01)
  *H01L 29/66* (2006.01)
  *H01L 29/165* (2006.01)
  *H01L 21/02* (2006.01)
  *H01L 29/423* (2006.01)

(52) U.S. Cl.
  CPC .... *H01L 21/823828* (2013.01); *H01L 27/092* (2013.01); *H01L 27/0924* (2013.01); *H01L 29/0649* (2013.01); *H01L 29/0673* (2013.01); *H01L 29/1054* (2013.01); *H01L 29/165* (2013.01); *H01L 29/42392* (2013.01); *H01L 29/6681* (2013.01); *H01L 29/66545* (2013.01); *H01L 29/66795* (2013.01); *H01L 29/785* (2013.01); *H01L 29/7842* (2013.01); *H01L 29/7843* (2013.01); *H01L 29/7849* (2013.01); *H01L 29/78696* (2013.01)

(58) Field of Classification Search
  CPC ............. H01L 29/785; H01L 29/78696; H01L 21/823878
  See application file for complete search history.

(56) References Cited

U.S. PATENT DOCUMENTS

| | | | |
|---|---|---|---|
| 2013/0228751 | A1* | 9/2013 | Gotsmann ......... H01L 29/78696 257/14 |
| 2015/0041858 | A1* | 2/2015 | Chan ............... H01L 21/823821 257/192 |
| 2016/0071729 | A1 | 3/2016 | Hatcher et al. |
| 2016/0111284 | A1 | 4/2016 | Kittl et al. |
| 2017/0323952 | A1* | 11/2017 | Cheng ................. H01L 29/7843 |
| 2018/0158952 | A1 | 6/2018 | Balakrishnan et al. |
| 2018/0261670 | A1 | 9/2018 | Yeung et al. |

OTHER PUBLICATIONS

Anonymous, "Nanosheet Dielectric Isolation through Self-Aligned Directional Process," IPCOM000253327D, Mar. 2018, 8 pages.
Anonymous, "Side-Anchoring Silicon-on-Nothing," IPCOM000250006D, May 2017, 6 pages.

* cited by examiner

TRANSISTOR HAVING STRAIN-INDUCING ANCHORS AND A STRAIN-ENHANCING SUSPENDED CHANNEL

BACKGROUND

The present invention relates in general to fabrication methods and resulting structures for semiconductor devices. More specifically, the present invention relates to fabrication methods and resulting structures for transistors having strain-inducing anchors configured and arranged to impart strain through end regions of the transistor's channel. In aspects of the invention, the strain in the transistor's channel is enhanced (or increased) by the strain-inducing anchors suspending the channel during fabrication.

In contemporary semiconductor device fabrication processes, a large number of semiconductor devices, such as n-type field effect transistors (nFETs) and p-type field effect transistors (pFETs), are fabricated on a single wafer. Non-planar transistor device architectures, such as fin-type FETs (FinFETs) and nanosheet (or nanowire) transistors, can provide increased device density and increased performance over planar transistors. In a known FinFET architecture, the channel is formed as a high aspect-ratio fin-shaped structure. A gate runs along sidewalls and a top surface of a central portion of the fin, and the central portion of the fin functions as the FinFET channel. Nanosheet transistors include a gate stack that wraps around the full perimeter of multiple nanosheet channel regions for improved control of channel current flow. Several FET performance parameters can be improved by introducing strain to one or more of the materials in the FET architecture. In general, a material is "strained" when its atoms have been stretched or compressed outside of their normal inter-atomic distances.

SUMMARY

Embodiments of the invention are directed to a method of fabricating an FET. A non-limiting example of the method includes forming a first-region channel over a first region of a substrate, wherein the first-region channel includes lateral sidewalls having a length (L), a first end sidewall having a first width (W1), and a second end sidewall having a second width (W2). L is greater than W1, and L is greater than W2. A first stress anchor is formed on the first end sidewall of the first-region channel, and a second stress anchor is formed on the second end sidewall of the first-region channel. The first stress anchor is configured to impart strain through the first end sidewalls to the first-region channel. The second stress anchor is configured to impart strain through the second end sidewalls to the first-region channel.

Embodiments of the invention are directed to a method of fabricating an FET. A non-limiting example of the method includes forming a first-region channel over a first region of a substrate, wherein the first-region channel includes lateral sidewalls having a first length (L1), a first end sidewall having a first width (W1), and a second end sidewall having a second width (W2). L1 is greater than W1, and L1 is greater than W2. A first stress anchor is formed on the first end sidewall of the first-region channel, and a second stress anchor is formed on the second end sidewall of the first-region channel. The first stress anchor is configured to impart strain through the first end sidewalls to the first-region channel. The second stress anchor is configured to impart strain through the second end sidewalls to the first-region channel. A second-region channel is formed over a second region of the substrate, wherein the second-region channel includes lateral sidewalls having a second length (L2), a third end sidewall having a third width (W3), and a fourth end sidewall having a fourth width (W4). L2 is greater than W3, and L2 is greater than W4. A third stress anchor is formed on the third end sidewall of the second-region channel, and a fourth stress anchor is formed on the fourth end sidewall of the second-region channel. The third stress anchor is configured to impart strain through the third end sidewalls to the second-region channel. The fourth stress anchor is configured to impart strain through the fourth end sidewalls to the second-region channel.

Embodiments of the invention are directed to an FET device. A non-limiting example of the device includes a first-region channel formed over a first region of a substrate, wherein the first-region channel includes lateral sidewalls having a length (L), a first end sidewall having a first width (W1), and a second end sidewall having a second width (W2). L is greater than W1, and L is greater than W2. A first stress anchor is formed on the first end sidewall of the first-region channel, and a second stress anchor is formed on the second end sidewall of the first-region channel. The first stress anchor is configured to impart strain through the first end sidewalls to the first-region channel. The second stress anchor is configured to impart strain through the second end sidewalls to the first-region channel.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the end of the specification. The foregoing and other features and advantages of the embodiments are apparent from the following detailed description taken in conjunction with the accompanying drawings in which:

FIGS. 2-10 depict various views of nanosheet-based structures after fabrication operations for forming nanosheet FETs having strained nanosheets in accordance with aspects of the invention, in which:

FIG. 2 depicts a cross-sectional view of the nanosheet-based structures after an initial set of fabrication operations in accordance with embodiments of the invention;

FIG. 3A depicts a top-down view of the nanosheet-based structures after additional fabrication operations in accordance with embodiments of the invention;

FIG. 3B depicts a cross-sectional view of the nanosheet-based structures shown in FIG. 3A taken along line A-A';

FIG. 3C depicts a cross-sectional view of the nanosheet-based structures shown in FIG. 3A taken along line B-B';

FIG. 4 depicts a cross-sectional view of the nanosheet-based structure, taken along line B-B', after additional fabrication operations in accordance with embodiments of the invention;

FIG. 5 depicts a cross-sectional view of the nanosheet-based structure, taken along line B-B', after additional fabrication operations in accordance with embodiments of the invention;

FIG. 8 depicts a cross-sectional view of the nanosheet-based structure, taken along line B-B', after additional fabrication operations in accordance with aspects of the invention;

FIG. 10 depicts a top-down view of the nanosheet-based structure, along with a cross-sectional view of the nanosheet-based structure taken along line B-B', after additional fabrication operations in accordance with embodiments of the invention.

DETAILED DESCRIPTION

Figure 1A:
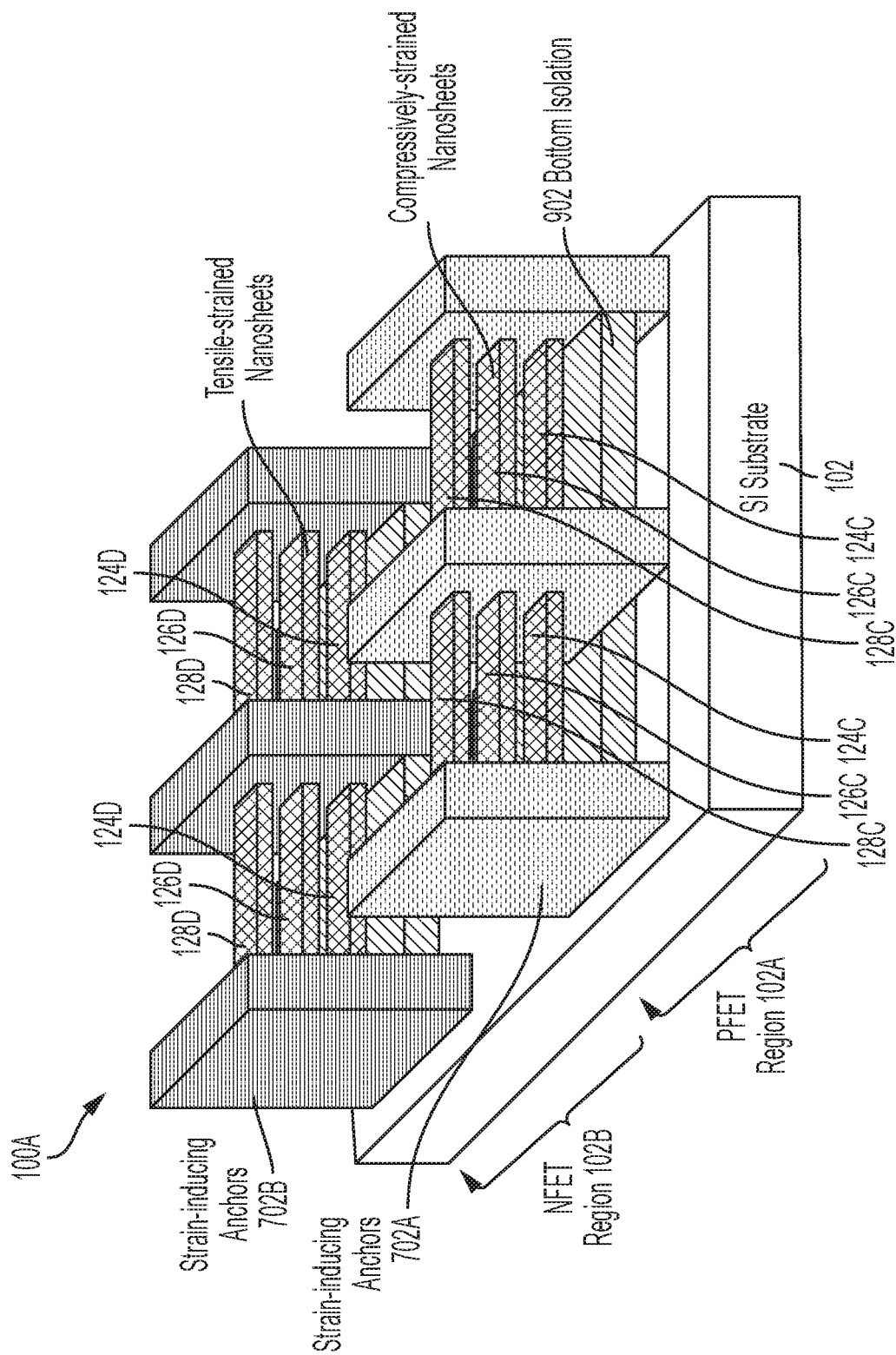
FIG. 1A depicts a three-dimensional (3D) simplified diagram illustrating nanosheet-based structures having strained nanosheets configured and arranged in accordance with embodiments of the invention.

Although this specification includes a detailed description of exemplary gate-all-around (GAA) nanosheet FET architectures having silicon (Si) channel nanosheets and SiGe sacrificial nanosheets, embodiments of the invention are not limited to a particular FET architecture or material described in this specification. For example, aspects of the invention described herein for GAA nanosheet transistors apply equally to a FinFET device architecture. Accordingly, embodiments of the present invention are capable of being implemented in conjunction with any other type of nanosheet/nanowire FET architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In the interest of brevity and because many steps in the manufacture of semiconductor devices and semiconductor-based ICs are well known, these steps will either be only mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage greater than a threshold is applied to a gate of the transistor, the switch is turned on, and current flows through the transistor. When the voltage applied at the gate is less than the threshold, the switch is off, and current does not flow through the transistor.

Typical semiconductor devices are formed using active regions of an IC wafer. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The active regions are defined by isolation regions used to separate and electrically isolate adjacent semiconductor devices.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of stacked nanosheets. In a known GAA configuration, a nanosheet-based FET includes a source region, a drain region and stacked nanosheet channels between the source and drain regions. The stacked nanosheet channels are spaced apart from one another, and a gate surrounds the spaced apart and stacked nanosheet channels to regulate electron flow through the nanosheet channels between the source and drain regions.

GAA nanosheet FETs can be fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling CMOS technology.

It is desirable to introduce strain to the channel region of an FET. For example, introducing a compressive strain (typically expressed as a percentage) into a PFET transistor tends to increase hole mobility in the channel, resulting in a faster switching response to changes in voltage applied to the transistor gate. Similarly, introducing a tensile strain into an NFET transistor tends to increase electron mobility in the channel, also resulting in a faster switching response.

Although the use of multiple layered SiGe/Si sacrificial/channel nanosheets (or Si/SiGe sacrificial/channel nanosheets) to form the channel regions in GAA FET semiconductor devices can introduce some degree of strain at the interface between SiGe nanosheets and Si nanosheets, it is currently difficult to introduce enough strain in the channel regions of a GAA FET semiconductor device to have a meaningful positive impact on transistor performance characteristics such as carrier mobility, switching speed, energy consumption, and the like.

Turning now to an overview of aspects of the invention, embodiments of the invention provide fabrication methods and resulting structures for transistors having strain-inducing anchors configured and arranged to impart strain through end regions of the transistor's channel. In aspects of the invention, the strain in the channel is enhanced (or increased) by configuring the fabrication operations such that the strain-inducing anchors suspend the channel. In other words, the fabrication operations are configured and arranged such that, for a predetermined period of time, the strain-inducing anchors are substantially the only support for the channel.

In some aspects of the invention, the transistor can be implemented as a GAA nanosheet transistor, and the channel can be a stack of nanosheet layers. In some aspects of the invention, the transistor can be implemented as a FinFET, and the channel can be a high-aspect-ratio fin. FIG. 1A is a simplified diagram showing GAA nanosheet-based structures on a portion of an IC wafer 100A after fabrication operations in accordance with embodiments of the invention, and FIG. 1B is a simplified diagram showing fin-based structures on a portion of an IC wafer 100B after fabrication operations in accordance with embodiments of the invention.

Figure 1B:
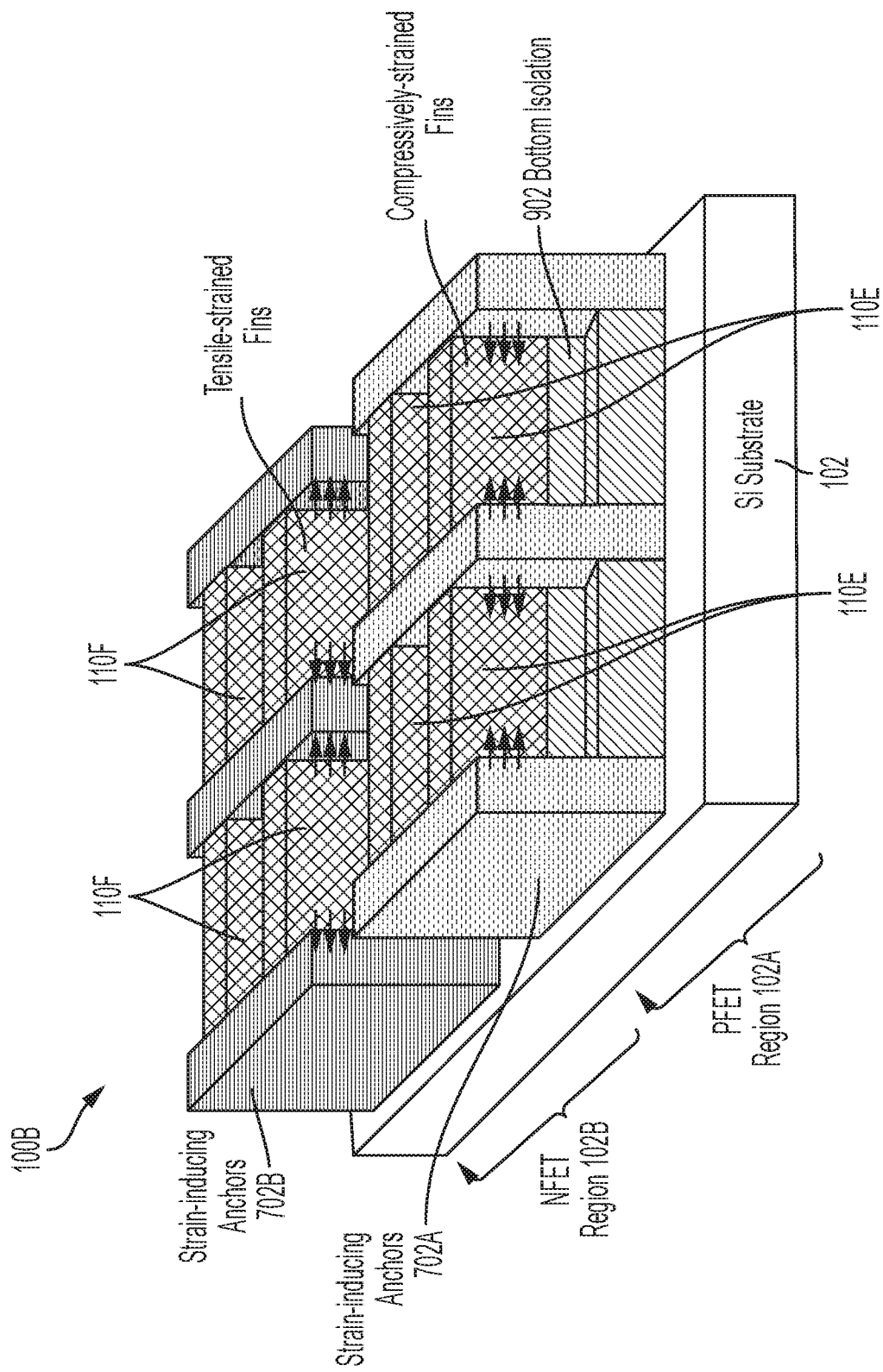
FIG. 1B depicts a three-dimensional (3D) simplified diagram illustrating fin-based structures having strained channel fins configured and arranged in accordance with embodiments of the invention.

Turning initially to FIG. 1B, FIG. 1B depicts aspects of the invention wherein the relevant transistor is implemented as a FinFET, and the channel is a set of high-aspect-ratio fins 110E (in the PFET region 102A), 110F (in the NFET region 102B). The IC wafer 100B shown in FIG. 1B is identical to the IC wafer 100A (shown in FIG. 1A) except that in the IC wafer 100B the channel is implemented as fins 110E, 110F instead of the nanosheet stacks (formed from nanosheets 124C, 126C, 128C, 124D, 126D, 128D) of the IC wafer 100A. Accordingly, the descriptions of the IC wafer 100A, as well as the descriptions of the fabrication operations depicted in FIGS. 2-9B, apply equally to the FinFET-based implementation of aspects of the invention as represented by the IC wafer 100B shown in FIG. 1B.

Figure 1C:
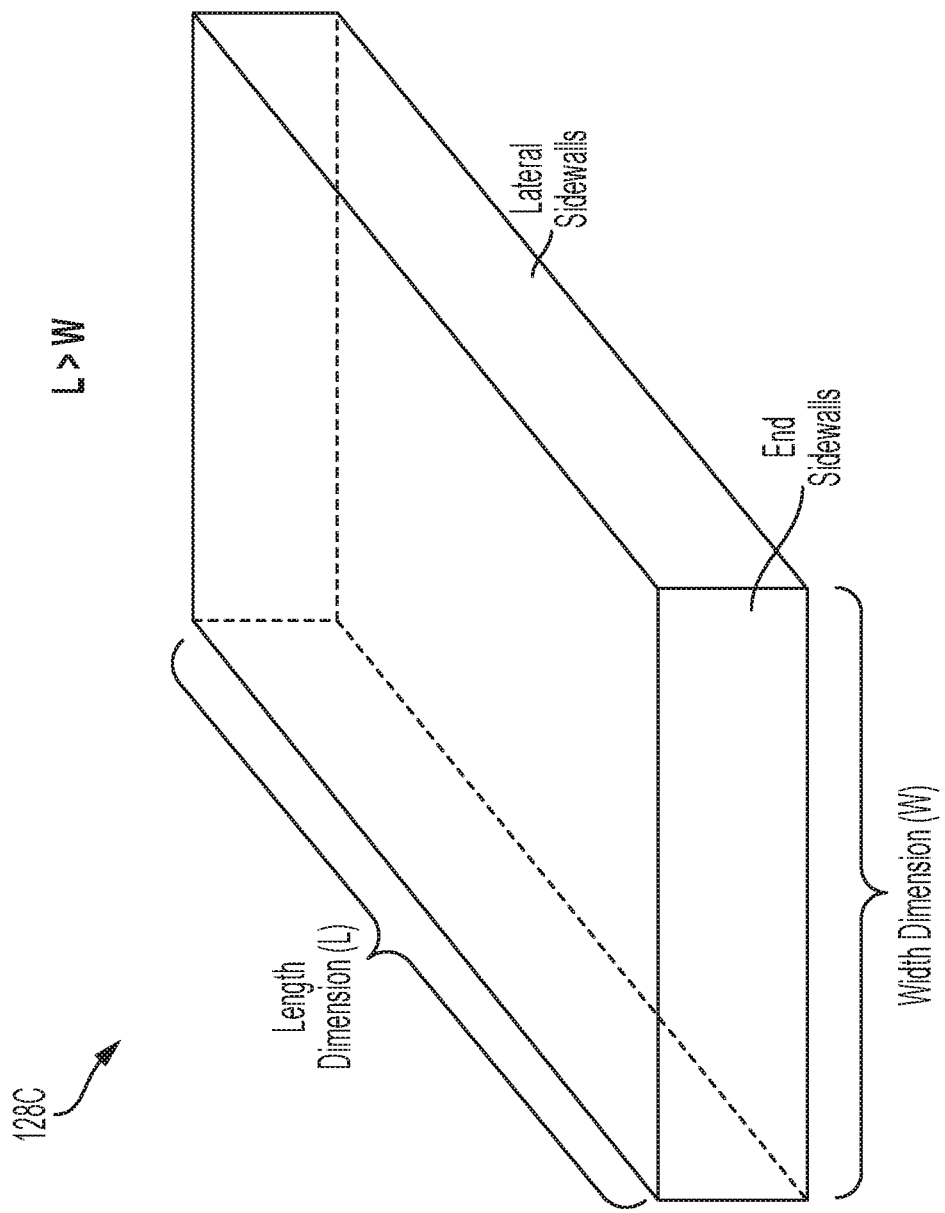
FIG. 1C depicts a 3D diagram illustrating details of an exemplary one of the strained nanosheets of the nanosheet-based structure shown in FIG. 1A.

An overview of aspects of the invention will now be provided with reference to FIGS. 1A and 1C, wherein FIG. 1A is a simplified diagram showing nanosheet-based structures on a portion of an IC wafer 100A after fabrication operations in accordance with embodiments of the invention, and wherein FIG. 1C depicts an isolated view of one channel nanosheet (i.e., channel nanosheet 128C) of the nanosheet-based structure in the PFET region 102A (shown in FIG. 1A). The diagram of the IC wafer 100A shown in FIG. 1A is simplified in that, for ease of illustration, sacrificial nanosheets (e.g., sacrificial nanosheets 114C, 116C, 118C, 114D, 116D, 118D shown in FIGS. 9A and 9B), which are ordinarily between the channel nanosheets 124C, 126C, 128C, 124D, 126D, 128D, are not depicted in FIG. 1A.

Referring to FIG. 1A, at the fabrication stage shown in FIG. 1A, the wafer 100A includes the substrate 102 having the PFET region 102A and the NFET region 102B. The nanosheet structures formed in the PFET region 102A include strain-inducing anchors 702A formed on end sidewalls (shown in FIG. 1C) of the channel nanosheets 124C, 126C, 128C, along with bottom isolation regions 902 formed below the bottommost channel nanosheets 124C. The nanosheet structures formed in the NFET region 102B include strain-inducing anchors 702B formed on end sidewalls of the channel nanosheets 124D, 126D, 128D, and bottom isolation regions 902 formed below the bottommost channel nanosheets 124D.

In accordance with embodiments of the invention, the strain-inducing anchors 702A are formed from a strain-inducing material having internal stress after deposition. In embodiments of the invention, the channel nanosheets 124C, 126C, 128C can be Si, and the strain-inducing anchors 702A can be a dielectric nitride material. Because the nanosheet-based structures in the PFET region 102A will be PFET GAA nanosheet transistors, the nitride material of the strain-inducing anchors 702A is selected to have an internal stress that compresses the channel nanosheets 124C, 126C, 128C when the strain-inducing anchors abut the channel nanosheets 124C, 126C, 128C, thereby imparting compressive strain to the channel nanosheets 124C, 126C, 128C. Introducing a compressive strain into the channel of a PFET transistor tends to increase the mobility of "hole" charge carriers in the channel, resulting in a faster switching response to changes in voltage applied to the transistor gate.

In accordance with embodiments of the invention, the strain-inducing anchors 702B are formed from a strain-inducing material having internal stress after deposition. In embodiments of the invention, the channel nanosheets 124D, 126D, 128D can be Si, and the strain-inducing anchors 702B can be a dielectric nitride material. Because the nanosheet-based structures in the NFET region 102B will be NFET GAA nanosheet transistors, the nitride material of the strain-inducing anchors 702B is selected to have an internal stress that stretches the channel nanosheets 124D, 126D, 128D, thereby imparting tensile strain to the channel nanosheets 124D, 126D, 128D. More specifically, as the atoms in the strain-receiving material attempt to align with the atoms of the strain-inducing material, the links between atoms in the strain-receiving material become stretched, thereby moving atoms further apart and resulting in a strained material. Moving atoms farther apart reduces the atomic forces that interfere with the movement of charge carriers (e.g., electrons) through the material, which results in better carrier mobility, better chip performance, faster switching, and lower energy consumption. Thus, introducing tensile strain into a channel of an NFET transistor tends to increase the mobility of electron charge carriers in the channel, resulting in a faster switching response to changes in voltage applied to the transistor gate.

In accordance with aspects of the invention, the anchors 702A, 702B are formed from a stress (or strain) inducing dielectric material such as silicon nitride, wherein the strain effect of the dielectric material is due to the facts that, depending on the deposition process condition, the dielectric material can internally have compressive stress, have tensile stress, or be stress-neutral (i.e., insignificant stress). Details of suitable deposition processes for providing the desired stress in the stress inducing dielectric material are described subsequently herein. In aspects of the invention, the stress in the stress inducing dielectric can range from about 0.5 GPa (gigapascal) to about 4 GPa. In some aspects of the invention, the stress in the stress inducing dielectric can range from about 1.5 GPa to about 2.5 GPa.

In accordance with aspects of the invention, the fabrication operations used to form the strain-inducing anchors 702A, 702B are integrated with the fabrication operations used to cut the nanosheet stack 110 (shown in FIG. 1A) to form the nanosheet stacks 110A, 110B, 110C, 110D (shown in FIGS. 3B, 3C, 6A, 6B). More specifically, in accordance with aspects of the invention, the pattern and etch operations used to cut the elongated fin-shaped nanosheet stacks 110A, 110B into the elongated fin-shaped nanosheet segments 110C, 110D also form anchor trenches 602 (shown in FIGS. 6A, 6B) in which the strain-inducing anchors 702A, 702B will be formed.

Figure 9A:
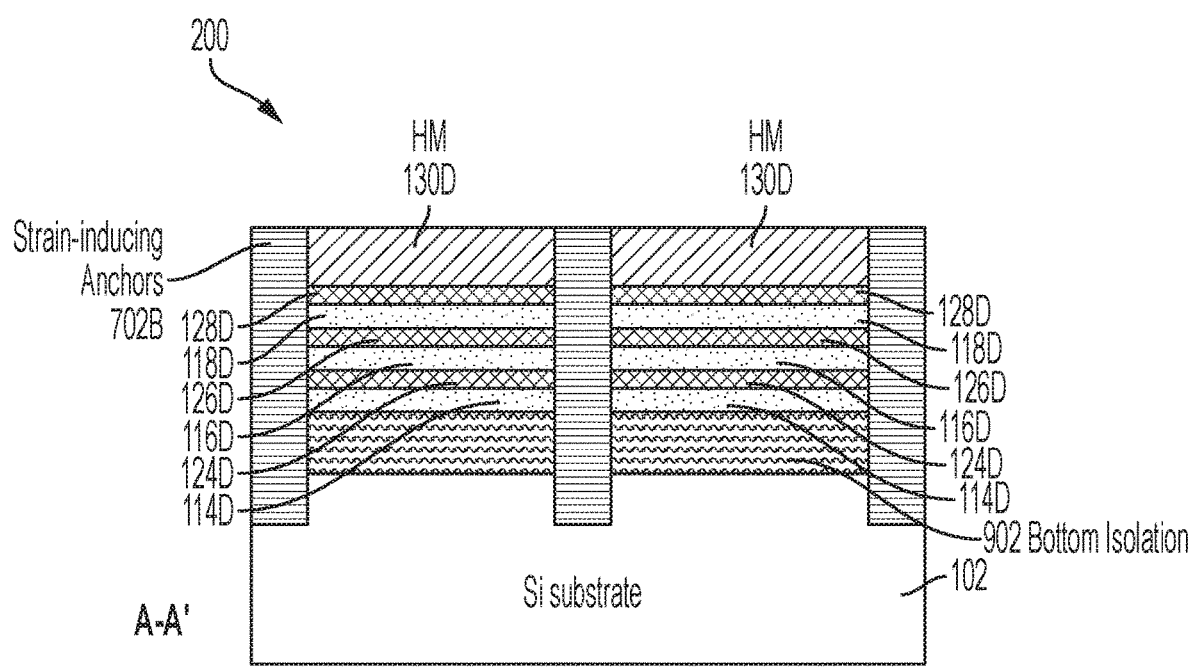
FIG. 9A depicts a cross-sectional view of the nanosheet-based structure, taken along line A-A', after additional fabrication operations in accordance with embodiments of the invention.
Figure 9B:
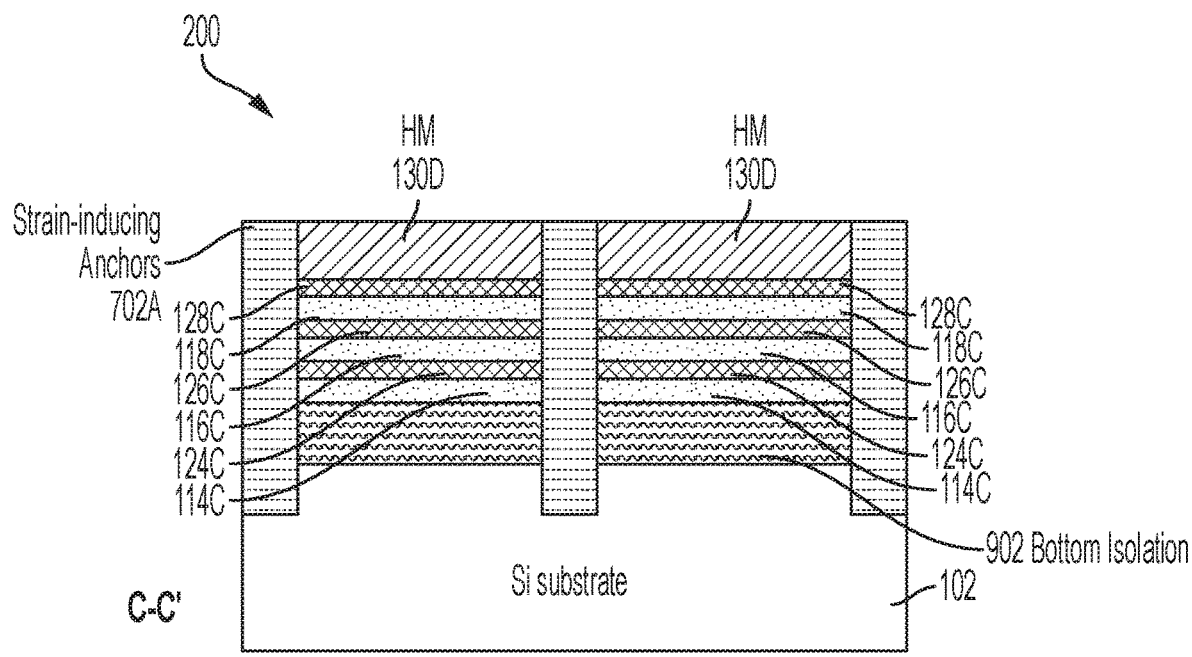
FIG. 9B depicts a cross-sectional view of the nanosheet-based structure shown in FIG. 9A, taken along line C-C'.

Referring still to FIG. 1A, as previously noted herein, the diagram of the wafer 100A is simplified in that, for ease of illustration, sacrificial nanosheets (e.g., sacrificial nanosheets 114C, 116C, 118C, 114D, 116D, 118D shown in FIGS. 9A and 9B), which are ordinarily between the channel nanosheets 124C, 126C, 128C, 124D, 126D, 128D of the nanosheet stacks 110C, 110D (shown in FIGS. 9A and 9B), are not depicted. However, in accordance with aspects of the invention, the strain-inducing anchors 702A, 702B are formed on end sidewalls of the nanosheet stacks 110C, 110D, and the nanosheet stacks 110C, 110D include the sacrificial nanosheets 114C, 116C, 118C, 114D, 116D, 118D shown in FIGS. 9A and 9B. In accordance with aspects of the invention, the ability of the strain-inducing anchors 702A, 702B to impart strain through the end sidewalls (shown in FIG. 1C) of the channel nanosheets 124C, 126C, 128C, 124D, 126D, 128D can be enhanced (or increased) by allowing the strain-inducing anchors 702A, 702B to, for a period of time, suspend the nanosheet stacks 110C, 110D such that the bottommost surfaces of the nanosheet stacks 110C, 110D are exposed and unsupported. When the bottommost surfaces of the nanosheet stacks 110A, 110B are exposed and unsupported, the nanosheet stacks 110C, 110D are supported substantially by the strain-inducing anchors 702A, 702B, which allows the strain-inducing anchors 702A, 702B to impart more strain through the end sidewalls (shown in FIG. 1C) of the channel nanosheets 124C, 126C, 128C, 124D, 126D, 128D.

In aspects of the invention, the bottommost surfaces of the nanosheet stacks 110C, 110D (stack 110C shown in FIG. 8) are exposed and unsupported during a process for forming the bottom isolation regions 902. In accordance with aspects of the invention, the bottom isolation regions 902 can be formed by growing a nanosheet stack 110 (shown in FIG. 2) on a sacrificial layer 112 (shown in FIG. 2), etching (or cutting) the nanosheet stack 110 to form the nanosheet stacks 110C, 110D (shown in FIGS. 6B and 6C), creating cavities 802 (shown in FIG. 8) under the nanosheet stacks 110C, 110D by selectively removing the sacrificial layer 112, and filling the cavities 802 with a dielectric material to form the bottom isolation regions 902 (shown in FIGS. 1A, 9A, and 9B). During the period of time between when the cavities 802 are created and when the cavities 802 are filled, the bottommost surfaces of the nanosheet stacks 110C, 110C are exposed and unsupported, thereby increasing the ability of the strain-inducing anchors 702A, 702B to impart more strain through the end sidewalls (shown in FIG. 1C) of the channel nanosheets 124C, 126C, 128C, 124D, 126D, 128D.

FIG. 1C depicts additional details of the channel nanosheet 128C, which includes end sidewalls having width dimensions (W), along with lateral sidewalls having length dimensions (L). The dimensions depicted in FIG. 1C are after the nanosheet stack 110 has been etched (or cut) to form the elongated fin-shaped nanosheet stack segments 110C, 110D (shown in FIGS. 6B and 6C). In embodiments of the invention, the other channel nanosheets 124C, 126C, 124D, 126D, 128D have substantially the same W and L as the channel nanosheet 128C shown in FIG. 1C. In embodiments of the invention, the channel nanosheets 124C, 126C, 128C, 124D, 126D, 128D can each have W and L dimensions that are not substantially the same, which can result, for example, from differences in fabrication process tolerances. In embodiments of the invention, the W/L dimensions of the channel nanosheets 124C, 126C, 128C, 124D, 126D, 128D can be a mixture, wherein some of the channel nanosheets 124C, 126C, 128C, 124D, 126D, 128D have substantially the same W and L dimensions, and wherein some of the channel nanosheets 124C, 126C, 128C, 124D, 126D, 128D have W and L dimensions that are not substantially the same as others of the channel nanosheets 124C, 126C, 128C, 124D, 126D, 128D.

Figure 2:
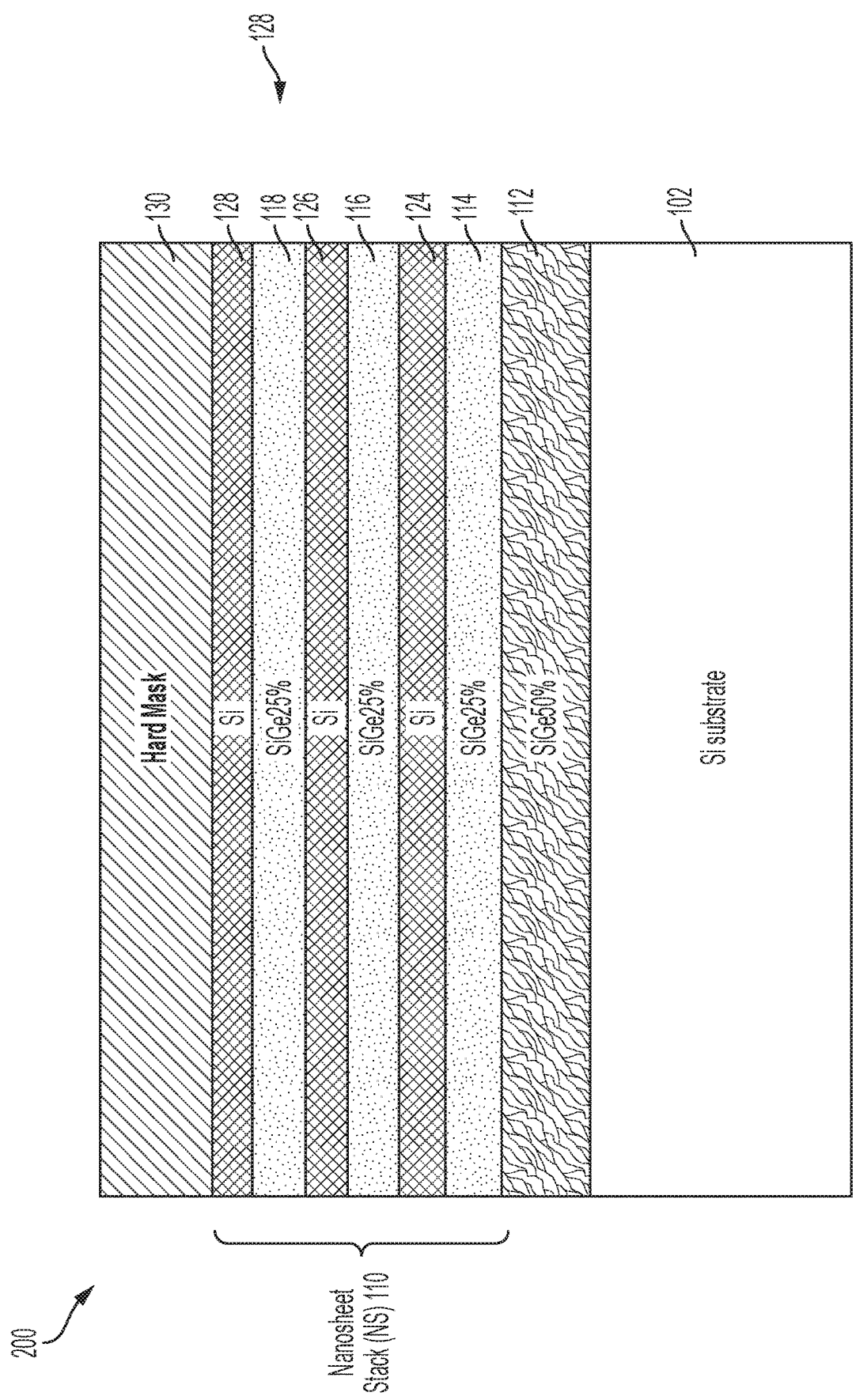
Figure 3:
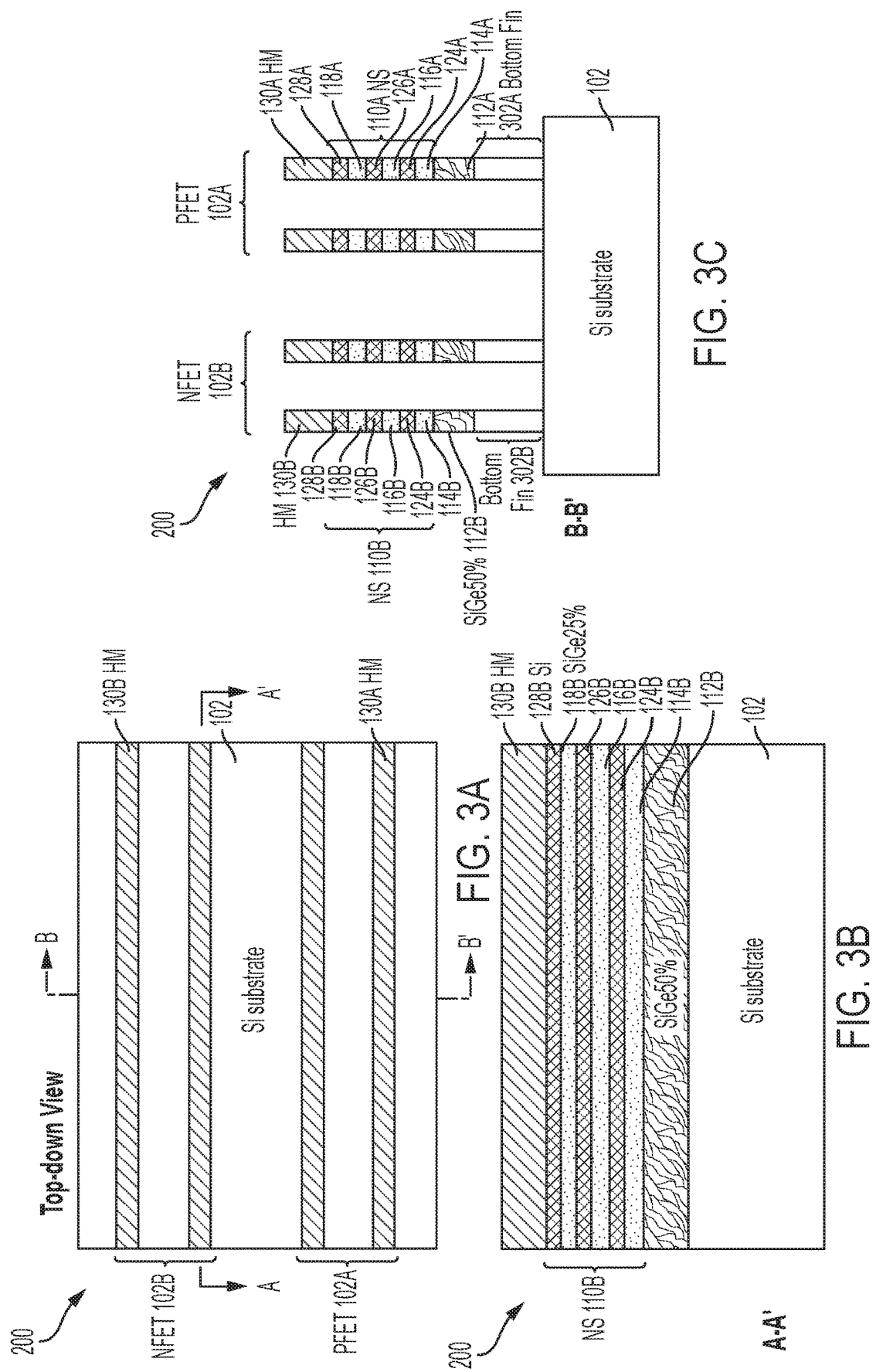

Turning now to a more detailed description of aspects of the invention, FIGS. 2-9B depict various views of portions of an IC wafer 200 after fabrication operations for forming nanosheet FETs having strained nanosheets 124C, 126C, 128C, 124D, 126D, 128D in accordance with aspects of the invention. Turning first to FIG. 2, a cross-sectional view of the IC wafer 200 is depicted after an initial set of fabrication operations in accordance with embodiments of the invention. More specifically, known fabrication operations have been used to fabricate the IC wafer 200 to include a substrate 102, a first sacrificial nanosheet layer 112, a nanosheet stack 110, and a hard mask layer 130, configured and arranged as shown. In accordance with aspects of the invention, the nanosheet stack 110 includes alternating layers of sacrificial nanosheets 114, 116, 118 and channel nanosheets 124, 126, 128.

In the illustrated embodiments of the invention, the substrate 102 includes a bulk silicon material. Alternatively, the substrate 102 can be implemented in a semiconductor-on-insulator (SOI) configuration. Other suitable semiconductor materials can be used as the substrate 102, including but not limited to monocrystalline Si, SiGe, III-V compound semiconductors, II-VI compound semiconductors, and the like. In some embodiments of the invention where the substrate 102 is an SOI configuration, the substrate 102 includes a buried oxide layer (not depicted). The buried oxide layer can be made of any suitable dielectric material, such as, for example, a silicon oxide.

The fabrication operations used to form the IC wafer 200 shown in FIG. 2 begins by forming the substrate 102 and forming thereon a bottommost nanosheet layer (i.e., a first sacrificial nanosheet layer) 112 on the substrate 102. The bottommost nanosheet layer 112 can be made of any suitable sacrificial material, such as, for example, SiGe. In some embodiments of the invention, the Ge concentration in the bottommost nanosheet layer 112 is selected to ensure etch selectivity against any Si, SiGe, or Ge layer that is part of the nanosheet stack 110 above the bottommost nanosheet layer 112. In some embodiments of the invention, the Ge concentration in the bottommost nanosheet layer 112 is at least about 15% higher than the Ge concentration in any SiGe layer that is formed in the nanosheet stack 110. In some embodiments of the invention, the bottommost nanosheet layer 112 can include a Ge concentration from about 45% to about 70%. In the embodiments of the invention depicted in FIG. 2, the Ge concentration of the bottommost nanosheet layer 112 is about 50%, although other Ge concentrations are within the contemplated scope of the invention. As shown in FIG. 2, the notation "SiGe50%" is used to indicate that about 50% of the SiGe material is Ge and about 50% of the SiGe material is Si. Similarly, the notation SiGe25% used in FIG. 2 (e.g., sacrificial nanosheet layers 114, 116, 118) indicates that about 25% of the SiGe material is Ge and about 75% of the SiGe material is Si.

The bottommost nanosheet layer 212 can be formed using a variety of methods, including, for example, chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and molecular beam epitaxy (MBE). In some embodiments of the invention, the bottommost nanosheet layer 212 can be epitaxially grown from gaseous or liquid precursors. Epitaxial semiconductor materials can be grown using vapor-phase epitaxy (VPE), MBE, liquid-phase epitaxy (LPE), or other suitable processes.

The nanosheet stack 110 is formed over the bottommost nanosheet layer 112. The alternating layers include sacrificial nanosheets 114, 116, 118 and channel nanosheets 124, 126, 128. In some embodiments of the invention, the sacrificial nanosheet layers 114, 116, 118 are SiGe and can be within a range from about SiGe 20% to about SiGe 40%. In the embodiments of the invention depicted in FIG. 2, the sacrificial nanosheet layers 114, 116, 118 are about SiGe 25%. In some embodiments of the invention, the channel nanosheets 124, 126, 128 are Si. In embodiments of the invention, the alternating layers of sacrificial nanosheets 114, 116, 118 and channel nanosheets 124, 126, 128 depicted in FIG. 2 can be formed by epitaxially growing one layer and then the next until the desired number and desired thicknesses of the sacrificial/channel nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

After fabrication of the nanosheet stack 110, a layer of hard mask material 130 is deposited over the nanosheet stack 110 using any hard mask material (e.g., SiOC) and any suitable deposition process.

FIG. 3A depicts a top-down view of the IC wafer 200 after additional fabrication operations in accordance with embodiments of the invention. FIG. 3B depicts a cross-sectional view of the IC wafer 200 shown in FIG. 3A taken along line A-A', and FIG. 3C depicts a cross-sectional view of the IC wafer 200 shown in FIG. 3A taken along line B-B'. As best shown in FIG. 3C, known fabrication operations have been used to pattern and etch the hard mask layer 130 (shown in FIG. 2) to form hard masks 130A, 130B. An etch (e.g., an RIE) or a recess is applied to remove the portions of the IC wafer 200 that are not covered by the patterned hard masks 130A, 130B, thereby forming the elongated fin-shaped nanosheet stacks 110A, 110B, bottommost nanosheet layers 112A, 112B, and bottom fins 302A, 302B in the PFET region 102A and the NFET region 102B of the substrate 102. The known fabrication operations have also been used to pattern and the hard mask layer 130. An etch (e.g., an RIE) or a recess is applied to remove the portions of the IC wafer 200 that are not covered by the patterned hard mask 130A, thereby forming the elongated fin-shaped nanosheet stacks 110A, bottommost nanosheet layers 112A, and bottom fins 302A in an the PFET region 102A of the substrate 102. The etch (e.g., an RIE) or recess is also applied to remove the portions of the IC wafer 200 that are not covered by the patterned hard masks 130B, thereby forming the elongated fin-shaped nanosheet stacks 110B, bottommost nanosheet layers 112B, and bottom fins 302B in an the NFET region 102B of the substrate 102.

Figure 4:
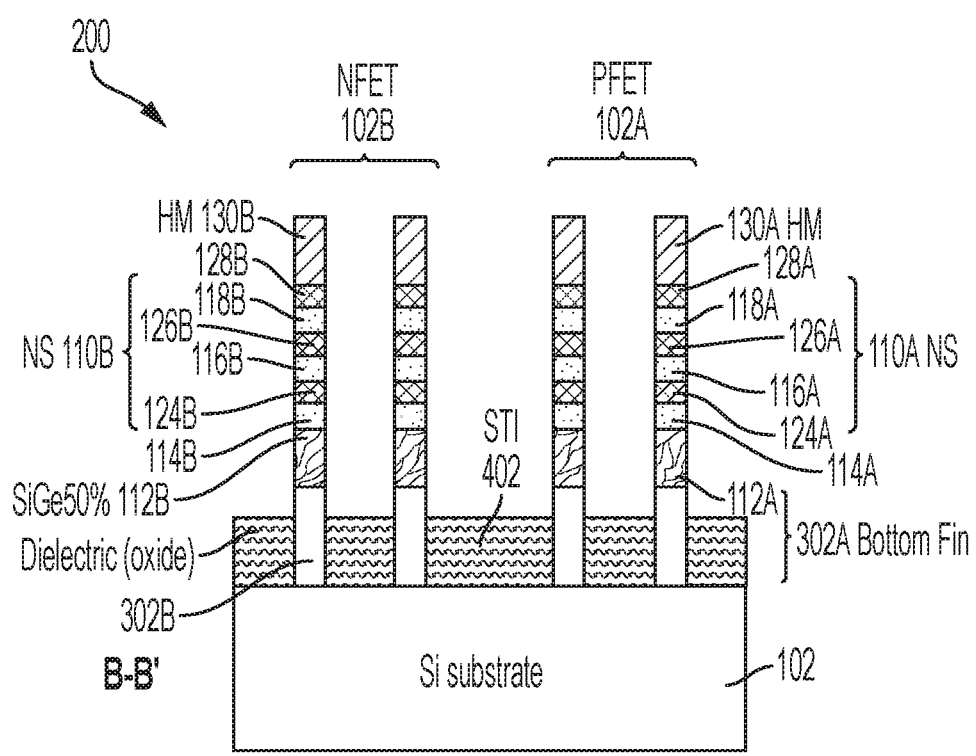

FIG. 4 depicts a cross-sectional view of the IC wafer 200, taken along line B-B', after additional fabrication operations in accordance with embodiments of the invention. Known fabrication operations have been used to form a dielectric material (e.g., an oxide such as $SiO_2$) to form shallow trench isolation (STI) regions 402. The STI regions 402 are formed by depositing an oxide material over the IC wafer 200 then recessing the oxide (e.g., using wet chemicals, plasma etch, or a combination of wet chemical etch and plasma etch) to form the STI regions 402.

Figure 5:
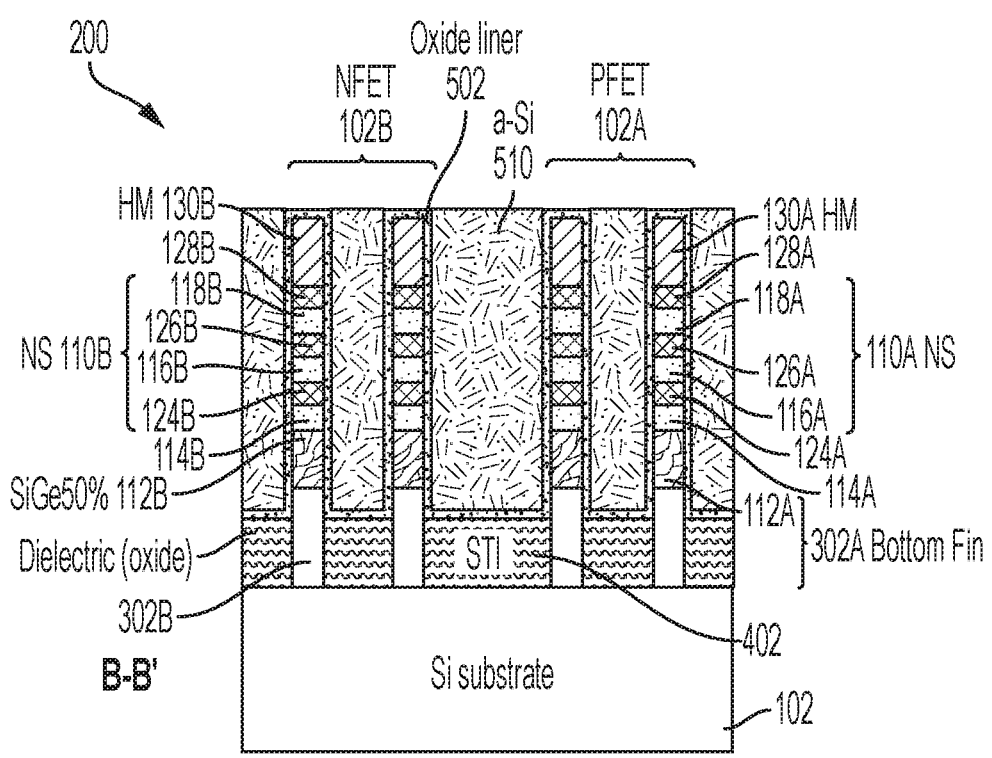

FIG. 5 depicts a cross-sectional view of the IC wafer 200, taken along line B-B', after additional fabrication operations in accordance with embodiments of the invention. Known fabrication operations have been used to deposit a thin protective oxide liner 502 over the IC wafer 200. A sacrificial fill material 510 is deposited over the oxide liner 502 and planarized. The sacrificial fill material 510 can include a material that can be easily and selectively removed from the oxide liner 502, including, but not limited to, poly-silicon (p-Si), amorphous silicon (a-Si), amorphous carbon (a-C), silicon oxide (SiO), silicon nitride (SiN), silicon oxynitride (SiON), and combinations thereof. In the non-limiting example depicted in FIGS. 2-9B, the sacrificial fill material 510 is a-Si.

Figure 6A:
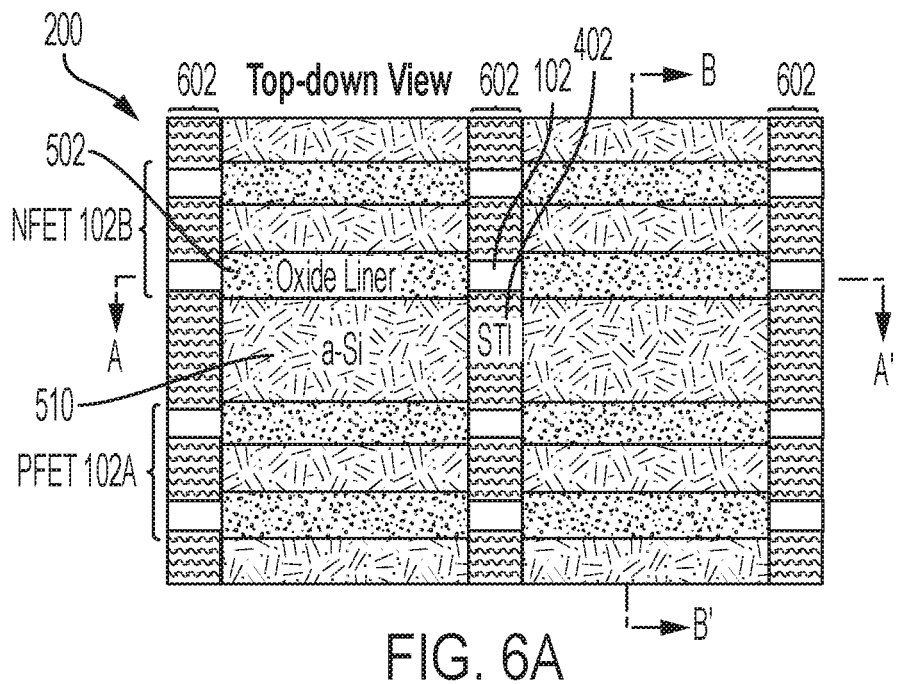
FIG. 6A depicts a top-down view of the nanosheet-based structure after additional fabrication operations in accordance with embodiments of the invention.
Figure 6B:
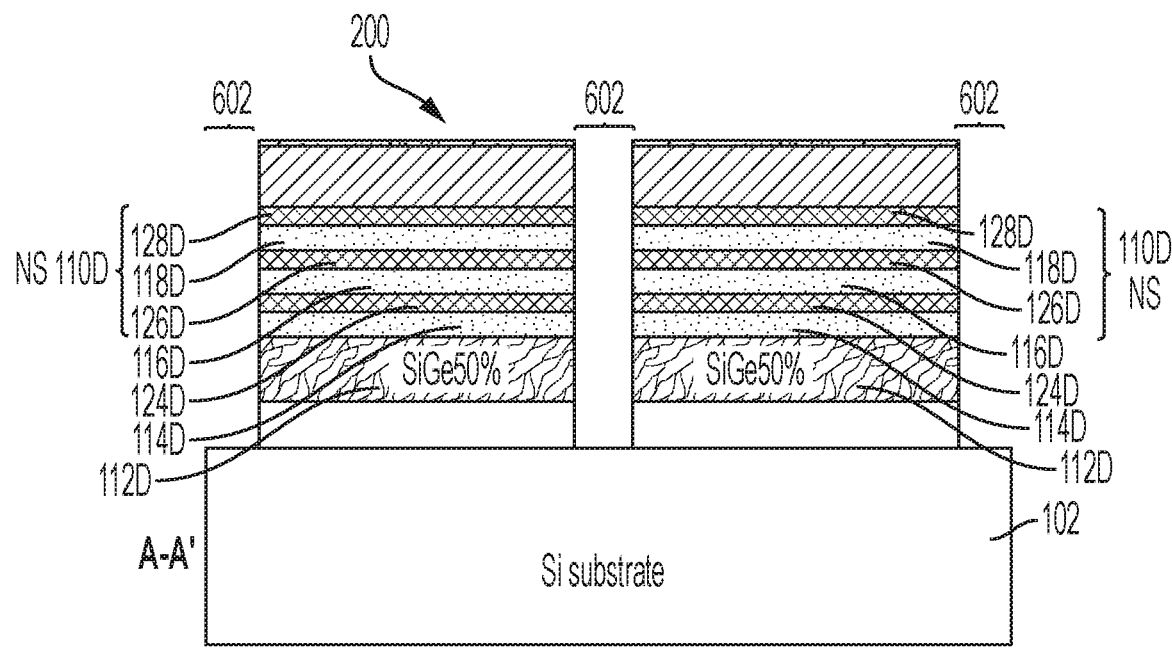
FIG. 6B depicts a cross-sectional view of the nanosheet-based structure shown in FIG. 6A taken along line A-A'.
Figure 6C:
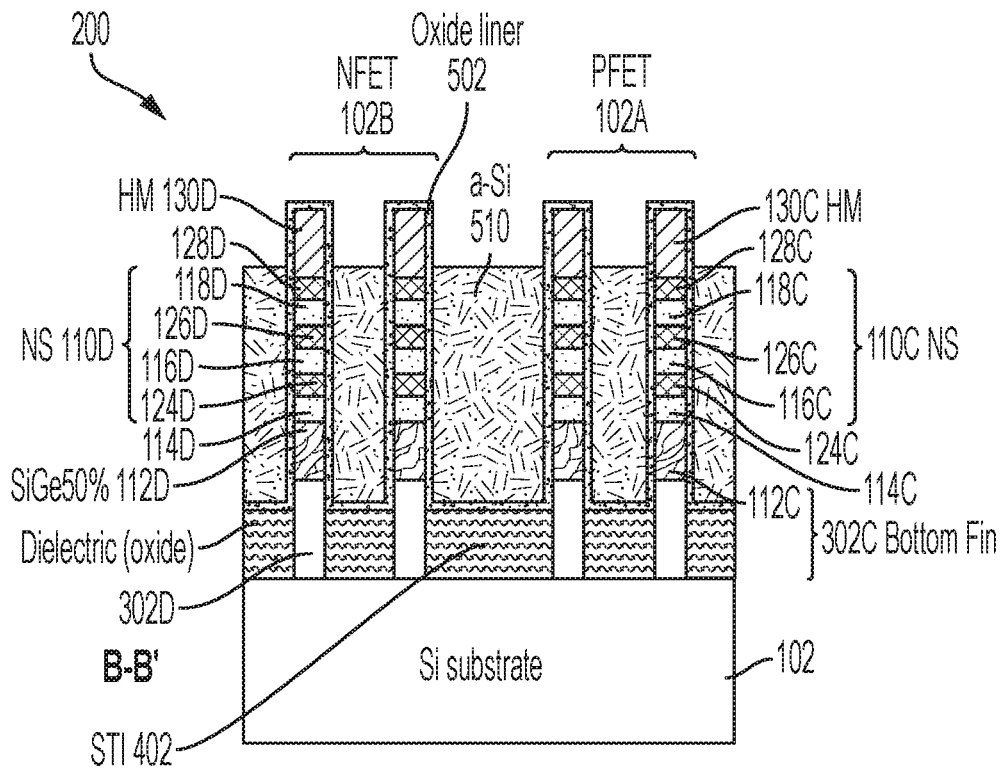
FIG. 6C depicts a cross-sectional view of the nanosheet-based structure shown in FIG. 6A taken along line B-B'.

FIG. 6A depicts a top-down view of the IC wafer 200 after additional fabrication operations in accordance with embodiments of the invention. FIG. 6B depicts a cross-sectional view of the IC wafer 200 shown in FIG. 6A taken along line A-A', and FIG. 6C depicts a cross-sectional view of the IC wafer 200 shown in FIG. 6A taken along line B-B'. As best shown in FIG. 6C, known semiconductor fabrication operations have been used to recess the sacrificial fill material 510 to the level shown. As best shown in FIGS. 6A and 6B, known fabrication operations have been used to cut or otherwise remove portions of the elongated fin-shaped nanosheet stacks 110A, 110B (shown in FIG. 5) to create elongated fin-shaped nanosheet stack segments 110C, 110D. The known fabrication operations used to create the elongated fin-shaped nanosheet stack segments 110C, 110D can include a so-called "fin cut" process that cuts (or removes) portions of the elongated fin-shaped nanosheet stacks 110A, 110B to define the length dimension L (shown in FIG. 1C). In accordance with aspects of the invention, the FC etching processes uses an etching mask configured and arranged to define the unwanted portions of the elongated fin-shaped nanosheet stacks 110A, 110B, as well as the areas of the sacrificial fill material 510 that will be removed to form the strain-inducing anchor trenches 602 in which the strain-inducing anchor trenches 702A, 702B (shown in FIGS. 1A, 7A, 7B) will be formed. The fin cut process can be a series of anisotropic cut/etch processes selective to the various layers of the elongated fin-shaped stacks 110A, 110B, the bottommost nanosheet layers 112A, 112B, and the bottom fin 302A, 302B (shown in FIG. 6B). After the fin cut process has been applied, elongated fin-shaped stacks 110C, 110D, the bottommost nanosheet layers 112C, 112D, and the bottom fin 302C, 302D have been formed. The process used to remove selected portions of the sacrificial fill material 510 to form the anchor trenches 602 can be an anisotropic etch process that is selective to the sacrificial fill material 510, which, in the example depicted in FIGS. 6A and 6C, is a-Si. The FC cut process and the process used to remove selected portions of the sacrificial fill material 510 to form the anchor trenches 602 can be performed in any suitable order.

Figure 7A:
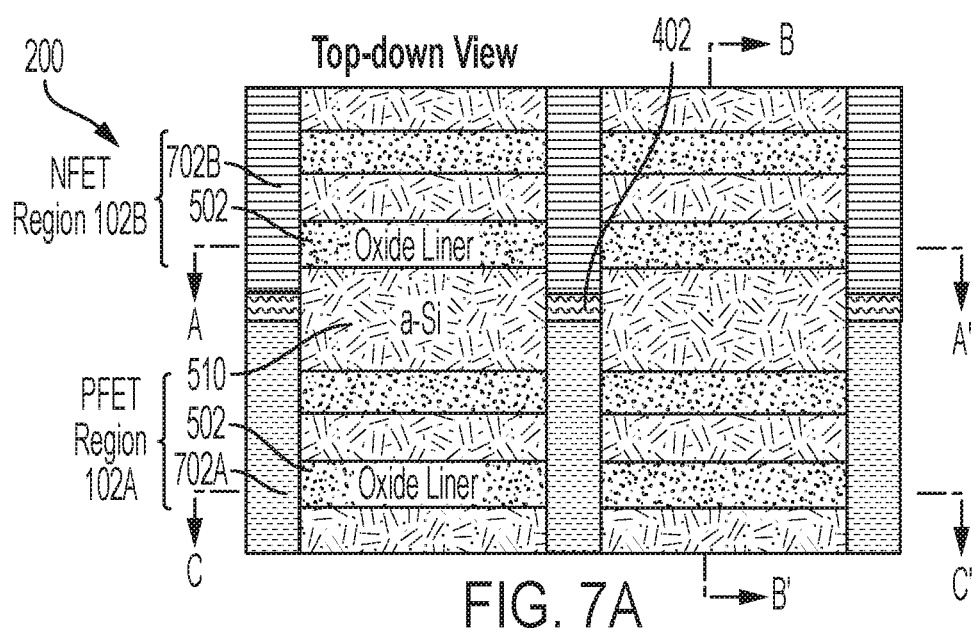
FIG. 7A depicts a top-down view of the nanosheet-based structure after additional fabrication operations in accordance with embodiments of the invention.
Figure 7B:
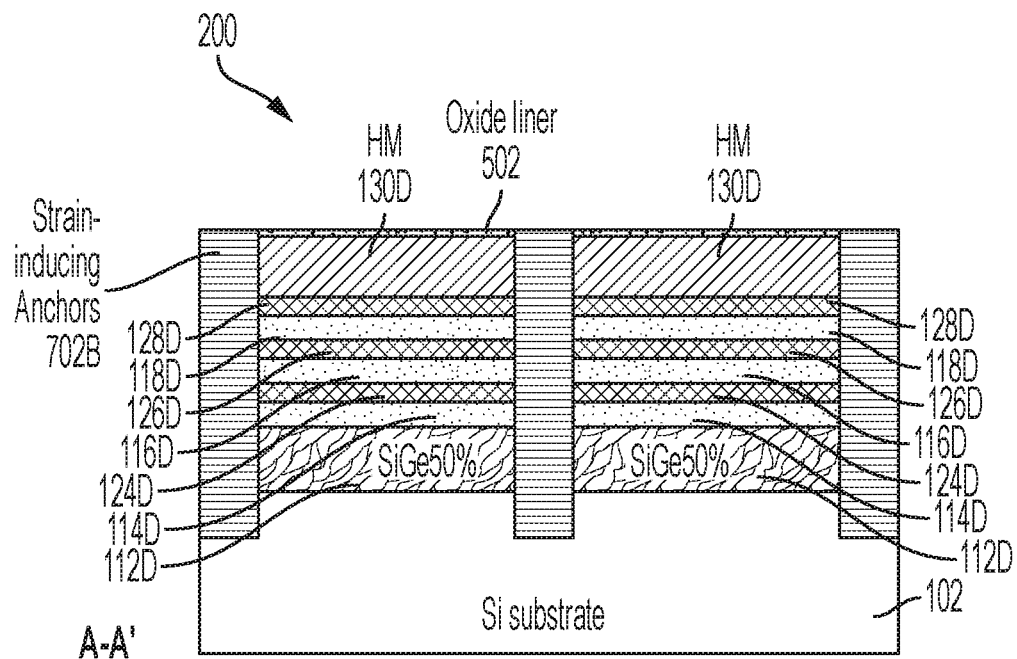
FIG. 7B depicts a cross-sectional view of the nanosheet-based structure shown in FIG. 7A taken along line A-A'.
Figure 7C:
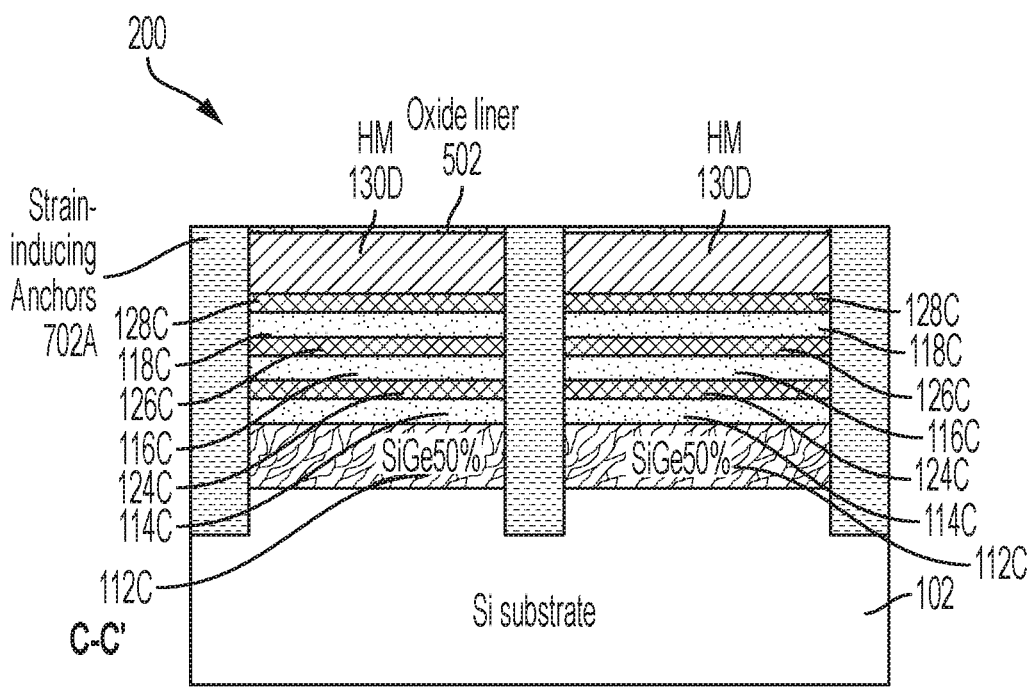
FIG. 7C depicts a cross-sectional view of the nanosheet-based structure shown in FIG. 7A taken along line C-C'.

FIG. 7A depicts a top-down view of the IC wafer 200 after additional fabrication operations in accordance with embodiments of the invention. FIG. 7B depicts a cross-sectional view of the IC wafer 200 shown in FIG. 7A taken along line A-A', and FIG. 7C depicts a cross-sectional view of the IC wafer 200 shown in FIG. 7A taken along line C-C'. As best shown in FIGS. 7A and 7C, fabrication operations have been used to form the strain-inducing anchors 702A within the anchor trenches 602 in the PFET region 102A of the substrate 102. In accordance with aspects of the invention, the strain-inducing anchors 702A can be formed by blocking the NFET region 102B (e.g., using a blocking mask (not shown)) and depositing a dielectric material (e.g., a nitride) to fill the anchor trenches 602 in the PFET region 102A of the substrate 102. The dielectric material deposited in the anchor trenches 602 is planarized. In accordance with embodiments of the invention, the dielectric material deposited in the anchor trenches 602 is a strain-inducing dielectric material that poses strain to the channel nanosheets 124C, 126C, 128C to which the strain-inducing anchors 702A are attached. The strain-inducing dielectric material also serves as electrical isolation between two adjacent nanosheet stacks (e.g., nanosheet stacks 110D shown in FIG. 6B, or fins 110E shown in FIG. 1B). In aspects of the invention, the strain-inducing material used to form the strain-inducing anchors 702A can be any suitable dielectric material such as a nitride, amorphous carbon or a compressive oxide. In some embodiments, the strain-inducing material can include two or more different materials (e.g., silicon nitride and/or silicon oxide). Because the nanosheet-based structures in the PFET region 102A will be PFET GAA nanosheet transistors, silicon nitride material of the strain-inducing anchors 702A is selected and deposited in a manner that compresses the channel nanosheets 124C, 126C, 128C, thereby imparting compressive strain to the channel nanosheets 124C, 126C, 128C. Introducing a compressive strain into the channel of a PFET transistor tends to increase the mobility of "hole" charge carriers in the channel, resulting in a faster switching response to changes in voltage applied to the transistor gate.

As best shown in FIGS. 7A and 7B, fabrication operations have been used to form the strain-inducing anchors 702B within the anchor trenches 602 in the NFET region 102B of the substrate 102. In accordance with aspects of the invention, the strain-inducing anchors 702B can be formed by blocking the PFET region 102A (e.g., using a blocking mask (not shown)) and depositing a dielectric material (e.g., a nitride) to fill the anchor trenches 602 in the NFET region 102B of the substrate 102. The dielectric material deposited in the anchor trenches 602 is planarized. In accordance with embodiments of the invention, the dielectric material deposited in the anchor trenches 602 is a stress-inducing material having internal stress to pose tensile strain to the channel nanosheets 124D, 126D, 128D to which the strain-inducing anchors 702B are attached. In aspects of the invention, the strain-inducing material used to form the strain-inducing anchors 702B can be any suitable dielectric material such as a nitride, amorphous carbon or a compressive oxide. In some embodiments, the stress-inducing material can include two or more different materials (e.g., silicon nitride and/or silicon oxide). Because the nanosheet-based structures in the NFET region 102B will be NFET GAA nanosheet transistors, the dielectric nitride material of the strain-inducing anchors 702B stretches the channel nanosheets 124D, 126D, 128D, thereby imparting tensile strain to the channel nanosheets 124D, 126D, 128D. More specifically, as the atoms in the strain-receiving material attempt to align with the atoms of the strain-inducing material, the links between atoms in the strain-receiving material become stretched, thereby moving atoms further apart and resulting in a strained material. Moving atoms farther apart reduces the atomic forces that interfere with the movement of charge carriers (e.g., electrons) through the material, which results in better carrier mobility, better chip performance, faster switching, and lower energy consumption. Thus, introducing tensile strain into a channel of an NFET transistor tends to increase the mobility of electron charge carriers in the channel, resulting in a faster switching response to changes in voltage applied to the transistor gate.

In accordance with aspects of the invention, the strain-inducing anchors 702B can be formed, for example, using plasma-enhanced chemical vapor deposition (PECVD) or high density plasma chemical vapor deposition (HDPCVD). In some embodiments of the invention, PECVD can provide nitride strain inducing liners having a compressive internal strain. The stress state of the deposited nitride strain inducing liner can be set by changing the deposition conditions to alter the reaction rate within the deposition chamber in which the deposition conditions include gas flow rate, pressure, radio frequency power, and electrode gap. A silicon nitride stressed material having higher compressive stress values can be obtained by increasing radio frequency (RF) energy bombardment to achieve higher film density, by having more Si—N bonds in the deposited material, and by reducing the density of Si—H and N—H bonds. Higher deposition temperatures and RF power improve the compressive stress levels of the deposited film. In addition, higher compressive stresses levels can be obtained in the deposited material at higher kinetic energy levels of plasma species. Bombardment of energetic plasma species, such as plasma ions and neutrals, generates compressive stresses in the deposited material because film density increases.

For the strain-inducing anchors 702B in the NFET region 102B, the tensile stress inducing material used to form the anchors 702B can be a dielectric that generates a tensile stress on adjacent nanosheet or fin structures. In some embodiments of the invention, the tensile stress inducing stress dielectric can be a tensile silicon nitride and can be formed using, e.g., plasma enhanced chemical vapor deposition (PECVD). The PECVD process can provide nitride stress-inducing layers having an intrinsic tensile strain. The stress state of the nitride stress including material deposited by PECVD can be controlled by changing the deposition conditions to alter the reaction rate within the deposition chamber. More specifically, the stress state of the deposited nitride strain inducing material can be set by changing the deposition conditions such as gas flow rate, pressure, radio frequency power, and electrode gap. In some embodiments of the invention, rapid thermal chemical vapor deposition (RTCVD) can be used to provide nitride tensile strain inducing dielectric having an internal tensile strain. The magnitude of the internal tensile strain produced within the nitride tensile strain inducing dielectric deposited by RTCVD can be controlled by changing the deposition conditions. More specifically, the magnitude of the tensile strain within the nitride tensile strain inducing dielectric can be set by changing deposition conditions such as precursor composition, precursor flow rate, and temperature. Alternative tensile stress inducing materials can include, for example, aluminum oxides, hafnium oxides, zirconium oxides, hafnium silicon oxides, or any combination thereof. A tensile stress inducing material can be a dielectric that generates a tensile stress on adjacent structures. In some embodiments of the invention, the strain-inducing material can include two more different materials.

Figure 8:
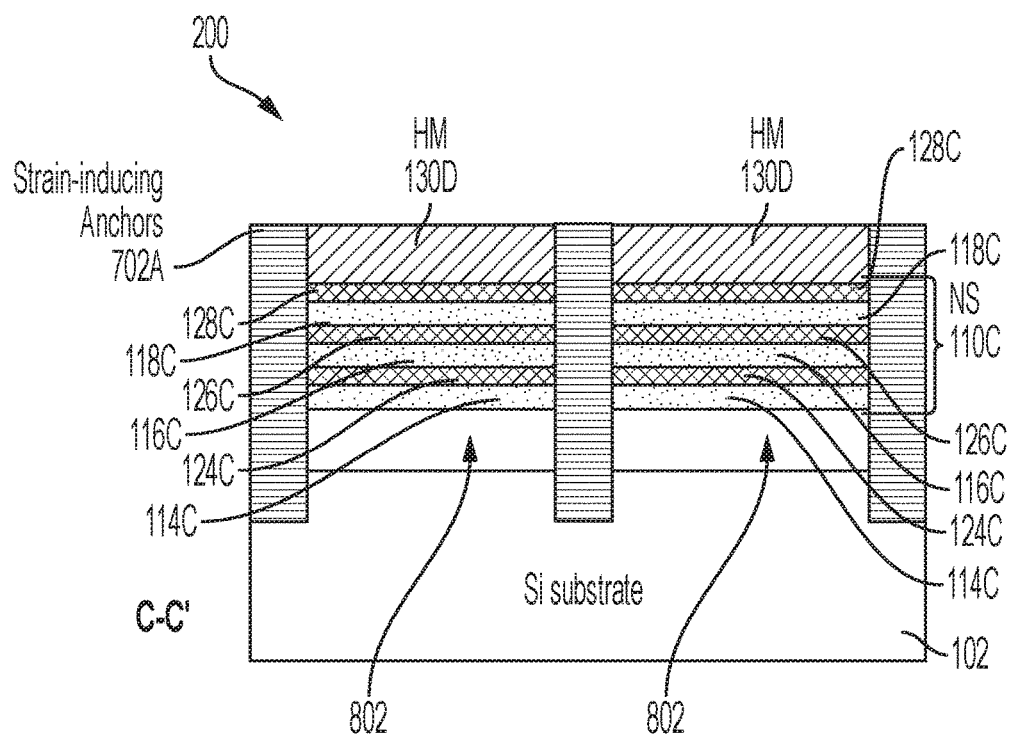

FIG. 8 depicts a cross-sectional view of the IC wafer 200, taken along line C-C', after additional fabrication operations in accordance with embodiments of the invention. As shown in FIG. 8, known semiconductor fabrication processes have been used to remove the bottommost layer 112 C (shown in FIG. 7C), thereby forming cavities 802. In embodiments of the invention, the bottommost layer 112C is formed from SiGe50%, which can be selectively etched with respect to the Si and SiGe25% using, for example, vapor phase hydrogen chloride (HCl). Substantially the same known fabrication operations are used to known semiconductor fabrication processes are used to remove the bottommost layer 112D (shown in FIG. 7B). In accordance with aspects of the invention, by removing the bottommost layer 112C underneath the nanosheet stack (e.g., 110C, 110D), the strain in the nanosheet stack induced by the adjacent strain-inducing nitride in the anchors 702A, 702B is further enhanced. The strain enhancement is due to the fact that by removing the bottommost layer 112C underneath the nanosheet stack, nanosheet stack become suspended and thus the strain in the strain-inducing nitride in the anchors 702A, 702B can be transferred to the suspended nanosheet stack more effectively.

Figure 9C:
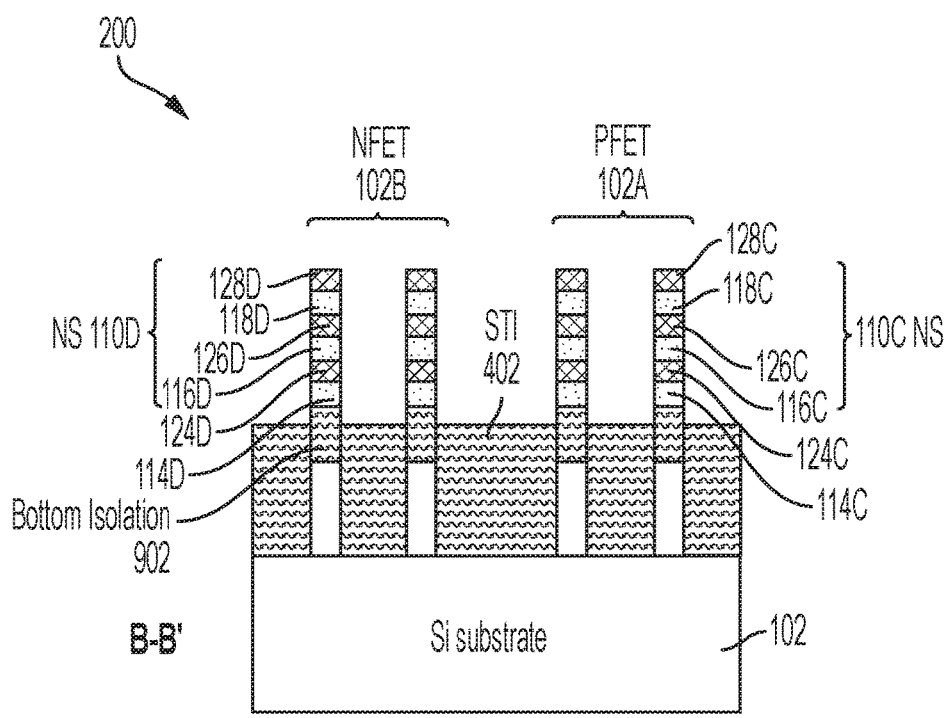
FIG. 9C depicts a cross-sectional view of the nanosheet-based structure shown in FIG. 9A, taken along line B-B'.

FIG. 9A depicts a cross-sectional view of the IC wafer 200, taken along line A-A', after additional fabrication operations in accordance with embodiments of the invention. FIG. 9B depicts a cross-sectional view of the IC wafer 200 shown in FIG. 9A, taken along line C-C', and FIG. 9C depicts a cross-sectional view of the IC wafer 200 shown in FIG. 9A, taken along line B-B'. As best shown in FIGS. 9A and 9B, known semiconductor device fabrication processes have been used to form bottom isolation regions 902 in the cavities 802 (shown in FIG. 8). In embodiments of the invention, the bottom isolation regions 902 can be formed using, e.g., a conformal deposition process and subsequent isotropic or anisotropic etch back to remove excess isolation material on the IC wafer 200. The conformally deposited isolation material pinches off in the cavities 802 to form the bottom isolation regions 902. The bottom isolation regions 902 can be formed of silicon nitride, silicoboron carbonitride, silicon carbonitride, silicon carbon oxynitride, or any other type of dielectric material (e.g., a dielectric material having a dielectric constant k of less than about 5), or any suitable combination of those materials.

FIG. 9A depicts a top-down view of the IC wafer 200, taken along line B-B', after additional fabrication operations in accordance with embodiments of the invention, and FIG. 9B depicts a cross-sectional view of the IC wafer 200 shown in FIG. 9A taken along line B-B'. As shown in FIGS. 9A and 9B, known fabrication operations have been used to form final nanosheet-based transistors in the PFET 102A and NFET 102B regions of the substrate 102. The known fabrication operations include removing the remaining portions of the sacrificial fill material 510; forming dummy gates (not shown) and gate spacers 1020 over and around central regions of the elongated fin-shaped nanosheet stack segments 110C, 110D (shown in FIGS. 6B and 6C); forming S/D regions 1002, 1004, 1012, 1014 in the portions of the elongated fin-shaped nanosheet stack segments 102C, 102D that are not under the dummy gates and the gate spacers 1020; forming inner spacers (not shown) along sidewalls (e.g., end sidewalls shown in FIG. 1C) of the sacrificial nanosheet layers 114C, 116C, 118C, 114D, 116D, 118D (shown in FIG. 10); releasing the sacrificial nanosheet layers 114C, 116C, 118C, 114D, 116D, 118D and removing the dummy gates; and applying a replacement-metal-gate (RMG) process to replace the dummy gates and the released sacrificial nanosheet layers 114C, 116C, 118C, 114D, 116D, 118D with metal gates 1032 and high-k gate dielectrics 1030.

Figure 10:
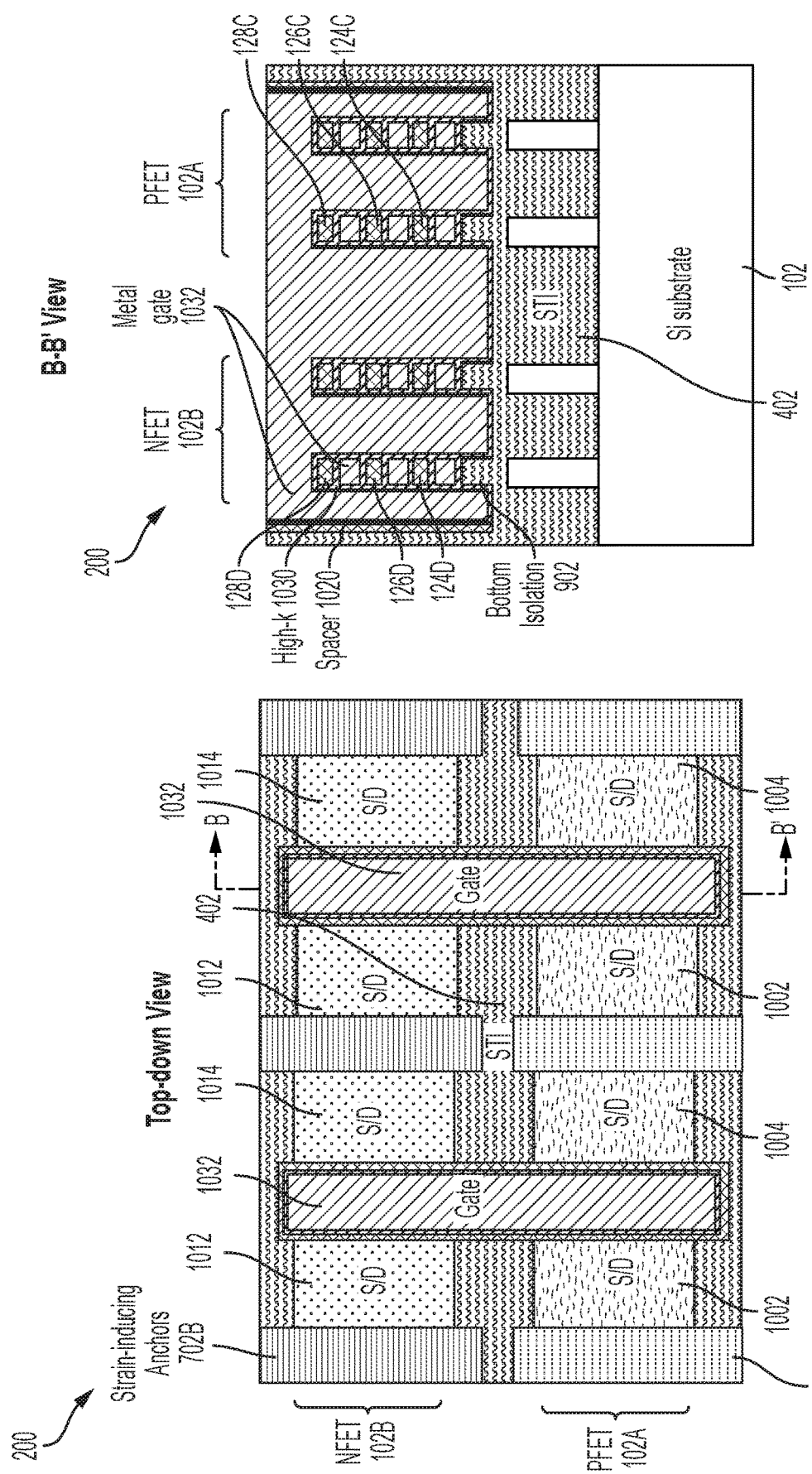

Because suitable methods for implementing the known fabrication operations that were applied to the IC wafer 200 shown in FIGS. 9A, 9B, 9C to form the IC wafer 200 shown in FIG. 10 are well known, in the interest of brevity, the specific details of the known fabrication operations that were applied to the IC wafer 200 shown in FIGS. 9A, 9B, 9C have been omitted in the interest of brevity. With respect to aspects of the invention, it is noted that in some embodiments of the invention the S/D regions 1002, 1004, 1012, 1014 are formed by cutting/removing the portions of the elongated fin-shaped nanosheet stack segments 102C, 102D that are not under the dummy gates and gate spacers 1020; replacing end sidewalls of the cut sacrificial nanosheet layers 114C, 116C, 118C, 114D, 116D, 118D with inner spacers (not shown); and epitaxially growing the S/D regions 1002, 1004, 1012, 1014 from end sidewalls of the cut channel nanosheets 124C, 126C, 128C, 124D, 126D, 128D. Under this approach, cutting the channel nanosheets 124C, 126C, 128C, 124D, 126D, 128D to form the S/D regions 1002, 1004, 1012, 1014 can relax some of the strain that was imparted to the channel nanosheets 124C, 126C, 128C, 124D, 126D, 128D by the strain-inducing anchors 702A, 702B. However, in accordance with aspects of the invention, the increased strain that results from suspending the elongated fin-shaped nanosheet segments 110C, 110D during fabrication (e.g., as shown in FIG. 8) can more than compensate for any reduction in channel strain that results from cutting the channel nanosheets 124C, 126C, 128C, 124D, 126D, 128D in order to epitaxially grow the S/D regions 1002, 1004, 1012, 1014 from end sidewalls of the cut channel nanosheets 124C, 126C, 128C, 124D, 126D, 128D.

In some embodiments of the invention the S/D regions 1002, 1004, 1012, 1014 can be formed without cutting/removing the portions of the elongated fin-shaped nanosheet stack segments 102C, 102D that are not under the dummy gates and gate spacers 1020. Under this approach, the S/D regions 1002, 1004, 1012, 1014 can be formed by selectively removing/releasing portions of the sacrificial nanosheet layers 114C, 116C, 118C, 114D, 116D, 118D that are not under the dummy gates and the gate spacers 1020 to expose end sidewalls of the sacrificial nanosheet layers 114C, 116C, 118C, 114D, 116D, 118D that were attached to the strain-inducing anchors 702A, 702B; replacing the exposed end sidewalls of the sacrificial nanosheet layers 114C, 116C, 118C, 114D, 116D, 118D with inner spacers (not shown); and forming source/drain S/D regions by epitaxially growing the S/D regions from the portions of the channel nanosheets 124C, 126C, 128C, 124D, 126D, 128D that are not under the gate spacers 1020 and the dummy gate. Under this approach, the portions of the channel nanosheets 124C, 126C, 128C, 124D, 126D, 128D that are not under the gate spacers 1020 and the dummy gate are incorporated into the structure of the S/D regions, and the process for forming the S/D regions does no replace that strain that is imparted to the channel nanosheets 124C, 126C, 128C, 124D, 126D, 128D by the strain-inducing anchors 702A, 702B.

In embodiments of the invention, the S/D regions 1002, 1004 in the PFET region 102A can be SiGe doped with boron (B) to form the necessary junctions for p-type nanosheet-based transistors. Similarly, the S/D regions 1012, 1014 in the NFET regions 102B can be Si doped with phosphorous (P) to form the necessary junctions for n-type nanosheet-based transistors. In embodiments of the invention, the S/D regions 1002, 1004, 1012, 1014 are formed using an epitaxial layer growth process. In-situ doping (ISD) can be applied during epitaxial growth to dope the S/D regions 1002, 1004, 1012, 1014, thereby creating the necessary junctions for transistor functionality. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

The gate spacers 1020 can be any suitable dielectric material including, for example, silicon oxide, silicon nitride, silicon oxynitride, SiBCN, SiOCN, SiOC, or any suitable combination of those materials.

The high-k gate dielectric 1030 can be formed from one or more high-k dielectric films (not shown). The high-k dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric films can further include dopants such as, for example, lanthanum and aluminum. The high-k dielectric films can be formed by suitable deposition processes, for example, CVD, PECVD, atomic layer deposition (ALD), evaporation, physical vapor deposition (PVD), chemical solution deposition, or other like processes. The thickness of the high-k dielectric films that form the high-k gate dielectric 1030 can vary depending on the deposition process as well as the composition and number of high-k dielectric materials used.

The metal gate 1032 can include a metal liner (e.g., a work function metal (WFM)) deposited over the high-k dielectric 1030 by a suitable deposition process, for example, CVD, PECVD, PVD, plating, thermal or e-beam evaporation, and sputtering. The type of WFM depends on the type of transistor and can differ between the NFET and PFET devices. P-type WFMs include compositions such as ruthenium, palladium, platinum, cobalt, nickel, and conductive metal oxides, or any combination thereof. N-type WFMs include compositions such as hafnium, zirconium, titanium, tantalum, aluminum, metal carbides (e.g., hafnium carbide, zirconium carbide, titanium carbide, and aluminum carbide), aluminides, or any combination thereof. The WFM can be deposited by a suitable deposition process, for example, CVD, PECVD, PVD, plating, thermal or e-beam evaporation, and sputtering. The metal gate structure 1032 and the gate dielectric layer 1030 surround the stacked channel nanosheets 124C, 126C, 128C, 124D, 126D, 128D and regulate electron flow through the channel nanosheets 124C, 126C, 128C, 124D, 126D, 128D between the S/D regions 1002, 1004, 1012, 1014.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a field effect transistor (FET), the method comprising fabrication operations that include:
   forming a first-region channel structure over a first region of a substrate, wherein a central region of the first-region channel structure functions as a channel of the FET;
   wherein the first-region channel structure further comprises lateral sidewalls having a length (L), a first end sidewall having a first width (W1), and a second end sidewall having a second width (W2);
   wherein L is greater than W1;
   wherein L is greater than W2;
   forming a first stress anchor on the first end sidewall of the first-region channel structure;
   forming a second stress anchor on the second end sidewall of the first-region channel structure;
   wherein the first stress anchor is configured to impart strain through the first end sidewall to the first-region channel structure;
   wherein the second stress anchor is configured to impart strain through the second end sidewall to the first-region channel structure;
   wherein the first stress anchor and the second stress anchor result in a first level of the strain imparted through the first end sidewall and the second end sidewall to the first-region channel structure;
   configuring the first-region channel structure such that, for a predetermined duration of time, the first-region channel structure is supported only by the first stress anchor and the second stress anchor; and
   selecting the predetermined duration of time such that the first stress anchor and the second stress anchor increase the first level of the strain to a second level of the strain.

2. The method of claim 1, wherein the strain imparted by the first stress anchor and the second stress anchor comprises a tensile strain.

3. The method of claim 1, wherein the strain imparted by the first stress anchor and the second stress anchor comprises a compressive strain.

4. The method of claim 1, wherein forming the first stress anchor and the second stress anchor comprises applying a patterned mask over a sacrificial fill material, removing selected portions of the sacrificial fill material defined by the patterned mask to form anchor trenches, filling a first one of the anchor trenches with a first stress anchor material, and filling a second one of the anchor trenches with a second stress anchor material.

5. The method of claim 4, wherein:
   the first-region channel structure is one of a plurality of first-region channel structures;
   the plurality of first-region channel structures comprises a first-region stack of nanosheet layers; and
   forming the first-region stack of nanosheet layers comprises forming an elongated fin-shaped nanosheet stack, applying the patterned mask such that the patterned mask is over the elongated fin-shaped nanosheet stack and the sacrificial fill material, and removing selected portions of the elongated fin-shaped nanosheet stack define by the patterned mask to form the first-region stack of nano sheet layers.

6. The method of claim 4, wherein configuring the first-region channel structure comprises:
   subsequent to forming the first stress anchor and the second stress anchor, exposing a bottom surface of the first-region channel structure, wherein exposing the bottom surface of the first-region channel structure increases the strain imparted by the first stress anchor and the second stress anchor; and
   forming the first-region channel structure such that the bottom surface of the first-region channel structure is on a sacrificial layer;
   wherein exposing the bottom surface of the first-region channel structure comprises removing the sacrificial layer from the bottom surface of the first-region channel structure.

7. The method of claim 1, wherein the first-region channel structure is one of a plurality of first-region channel structures.

8. The method of claim 7, wherein the plurality of first-region channel structures comprise a first-region stack of nanosheet layers.

9. A method of fabricating a plurality of field effect transistors (FETs), the method comprising fabrication operations that include:
   forming a first-region channel structure over a first region of a substrate, wherein a central region of the first-region channel structure functions as a channel of a first one of the plurality of FETs;
   wherein the first-region channel structure comprises lateral sidewalls having a first length (L1), a first end sidewall having a first width (W1), and a second end sidewall having a second width (W2);
   wherein L1 is greater than W1;
   wherein L1 is greater than W2;
   forming a first stress anchor on the first end sidewall of the first-region channel structure;

forming a second stress anchor on the second end sidewall of the first-region channel structure;
wherein the first stress anchor is configured to impart strain through the first end sidewall to the first-region channel structure;
wherein the second stress anchor is configured to impart strain through the second end sidewall to the first-region channel structure;
forming a second-region channel structure over a second region of the substrate, wherein a central region of the second-region channel structure functions as a channel of a second one of the plurality of FETs;
wherein the second-region channel structure further comprises lateral sidewalls having a second length (L2), a third end sidewall having a third width (W3), and a fourth end sidewall having a fourth width (W4);
wherein L2 is greater than W3;
wherein L2 is greater than W4;
forming a third stress anchor on the third end sidewall of the second-region channel structure;
forming a fourth stress anchor on the fourth end sidewall of the second-region channel structure;
wherein the third stress anchor is configured to impart strain through the third end sidewall to the second-region channel structure;
wherein the fourth stress anchor is configured to impart strain through the fourth end sidewall to the second-region channel structure;
wherein the first stress anchor and the second stress anchor result in a first level of the strain imparted through the first end sidewall and the second end sidewall to the first-region channel structure;
configuring the first-region channel structure such that, for a predetermined duration of time, the first-region channel structure is supported only by the first stress anchor and the second stress anchor;
wherein the third stress anchor and the fourth stress anchor result in a second level of the strain imparted through the third end sidewall and the fourth end sidewall to the second-region channel structure;
configuring the second-region channel structure such that, for the predetermined duration of time, the second-region channel structure is supported only by the third stress anchor and the fourth stress anchor; and
selecting the predetermined duration of time such that:
the first stress anchor and the second stress anchor increase the first level of the strain to a third level of the strain; and
the third stress anchor and the fourth stress anchor increase the second level of the strain to a fourth level of the strain.

10. The method of claim 9, wherein:
the strain imparted by the first stress anchor and the second stress anchor comprises a tensile strain; and
the strain imparted by the third stress anchor and the fourth stress anchor comprises a compressive strain.

11. The method of claim 9, wherein configuring the first-region channel structure further comprises, subsequent to forming the first stress anchor and the second stress anchor, exposing a bottom surface of the first-region channel structure.

12. The method of claim 11, wherein exposing the bottom surface of the first-region channel structure increases the strain imparted by the first stress anchor and the second stress anchor.

13. The method of claim 12, wherein exposing the bottom surface of the first-region channel structure comprises:
forming the first-region channel structure such that the bottom surface of the first-region channel structure is on a first-region sacrificial layer; and
removing the first-region sacrificial layer from the bottom surface of the first-region channel structure.

14. The method of claim 8, wherein configuring the second-region channel structure comprises, subsequent to forming the third stress anchor and the fourth stress anchor, exposing a bottom surface of the second-region channel structure.

15. The method of claim 14, wherein:
exposing the bottom surface of the second-region channel structure increases the strain imparted by the third stress anchor and the fourth stress anchor; and
exposing the bottom surface of the first-region channel structure comprises:
forming the second-region channel structure such that the bottom surface of the second-region channel structure is on a second-region sacrificial nanosheet layer; and
removing the second-region sacrificial nanosheet layer from the bottom surface of the second-region channel structure.

16. The method of claim 9, wherein the first-region channel comprises a first-region stack of nanosheet layers.

17. The method of claim 16, wherein the second-region stack comprises a second-region stack of nanosheet layers.

\* \* \* \* \*